US012687331B2

(12) United States Patent　　　(10) Patent No.:　US 12,687,331 B2
Sakai et al.　　　　　　　　　　　(45) Date of Patent:　　　Jul. 21, 2026

(54) MOVABLE COOLANT PROCESSING APPARATUS

(71) Applicant: Tokyo Electron Limited, Tokyo (JP)

(72) Inventors: Hayato Sakai, Kurokawa-gun (JP);
Takehiko Arita, Kurokawa-gun (JP);
Haruka Kaneko, Kurokawa-gun (JP);
Satoshi Suzuki, Kurokawa-gun (JP)

(73) Assignee: TOKYO ELECTRON LIMITED,
Tokyo (JP)

( * ) Notice: Subject to any disclaimer, the term of this
patent is extended or adjusted under 35
U.S.C. 154(b) by 0 days.

(21) Appl. No.: 18/495,040

(22) Filed: Oct. 26, 2023

(65) Prior Publication Data

US 2024/0053073 A1　　Feb. 15, 2024

Related U.S. Application Data

(63) Continuation of application No. 17/186,127, filed on
Feb. 26, 2021, now Pat. No. 11,835,278.

(30) Foreign Application Priority Data

Feb. 28, 2020　(JP) ................................. 2020-032749

(51) Int. Cl.
*F25B 41/40*　　　　(2021.01)
*F25B 49/00*　　　　(2006.01)
　　　　　(Continued)

(52) U.S. Cl.
CPC .............. *F25B 49/00* (2013.01); *F25B 41/40*
(2021.01); *F28F 27/02* (2013.01);
　　　　　(Continued)

(58) Field of Classification Search
CPC ........... F25B 41/40; F25B 49/00; F28F 27/02;
H01L 21/67248
See application file for complete search history.

(56) References Cited

U.S. PATENT DOCUMENTS 5,390,503 A　　2/1995　Cheng
8,141,620 B1　　3/2012　Zrodnikov et al.
　　　　(Continued)

FOREIGN PATENT DOCUMENTS

JP　　　2006-253454 A　　9/2006
JP　　　2013-172013 A　　9/2013
WO　　　　02/44634 A1　　6/2002

*Primary Examiner* — Jonathan Bradford
(74) *Attorney, Agent, or Firm* — XSENSUS LLP

(57)　　　　　ABSTRACT

A temperature control medium processing apparatus config-
ured to collect a temperature control medium from a module
using the temperature control medium or refill the module
with the temperature control medium includes a tank con-
figured to store the temperature control medium therein; a
first inlet path which is connected to a first inlet opening of
the tank, and through which the temperature control medium
is introduced; an inlet connector configured to connect the
first inlet path and a path from the module; an outlet path
which is connected to an outlet opening of the tank, and
through which the temperature control medium flows out; an
outlet connector configured to connect the outlet path and a
path to the module; and a pump provided at the outlet path,
and configured to force the temperature control medium
stored in the tank to flow out.

11 Claims, 4 Drawing Sheets

(51) Int. Cl.

| | | |
|---|---|---|
| F28F 27/02 | (2006.01) | |
| H01J 37/32 | (2006.01) | |
| H10P 72/00 | (2026.01) | |

(52) U.S. Cl.

CPC ... *F25B 2345/001* (2013.01); *F25B 2345/002* (2013.01); *F25B 2345/0052* (2013.01); *F25B 2345/006* (2013.01); *H01J 37/32724* (2013.01); *H10P 72/0602* (2026.01)

(56) References Cited

U.S. PATENT DOCUMENTS

| | | | | |
|---|---|---|---|---|
| 9,984,908 B2 * | 5/2018 | Kobayashi | ......... | G05D 23/1934 |
| 2009/0241560 A1 * | 10/2009 | Murray | ............. | B60H 1/00585 |
| | | | | 62/77 |
| 2013/0298578 A1 | 11/2013 | McMasters et al. | | |
| 2017/0106737 A1 * | 4/2017 | Gillett | .................. | B60B 19/003 |
| 2018/0112896 A1 | 4/2018 | James et al. | | |
| 2018/0277398 A1 | 9/2018 | Osada et al. | | |
| 2019/0113383 A1 * | 4/2019 | Sanhaji | ................. | G01G 23/02 |
| 2019/0131144 A1 | 5/2019 | Iwahata et al. | | |

* cited by examiner

MOVABLE COOLANT PROCESSING APPARATUS

CROSS-REFERENCE TO RELATED APPLICATION

This is a continuation application of U.S. Ser. No. 17/186,127, filed on Feb. 26, 2021, which claims the benefit of Japanese Patent Application No. 2020-032749 filed on Feb. 28, 2020, the entire disclosures of which are incorporated herein by reference.

TECHNICAL FIELD

The various aspects and embodiments described herein pertain generally to a temperature control medium processing apparatus and a temperature control medium processing method.

BACKGROUND

Patent Document 1 describes a substrate processing apparatus equipped with a processing vessel, a base having a path formed therein, an electrostatic chuck, a chiller, a first path, a second path, a bypass path and a flow rate control valve. The first path connects the chiller and a coolant inlet of the base. The second path connects the chiller and a coolant outlet of the base. The bypass path is branched from a portion of the first path and is connected to a portion of the second path. The flow rate control valve controls a flow rate of a coolant which flows into the bypass path.

Patent Document 1: Japanese Patent Laid-open Publication No. 2013-172013

SUMMARY

In one exemplary embodiment, a temperature control medium processing apparatus configured to collect a temperature control medium from a module using the temperature control medium or refill the module with the temperature control medium includes a tank configured to store the temperature control medium therein; a first inlet path which is connected to a first inlet opening of the tank, and through which the temperature control medium is introduced; an inlet connector configured to connect the first inlet path and a path from the module; an outlet path which is connected to an outlet opening of the tank, and through which the temperature control medium flows out; an outlet connector configured to connect the outlet path and a path to the module; and a pump provided at the outlet path, and configured to force the temperature control medium stored in the tank to flow out.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
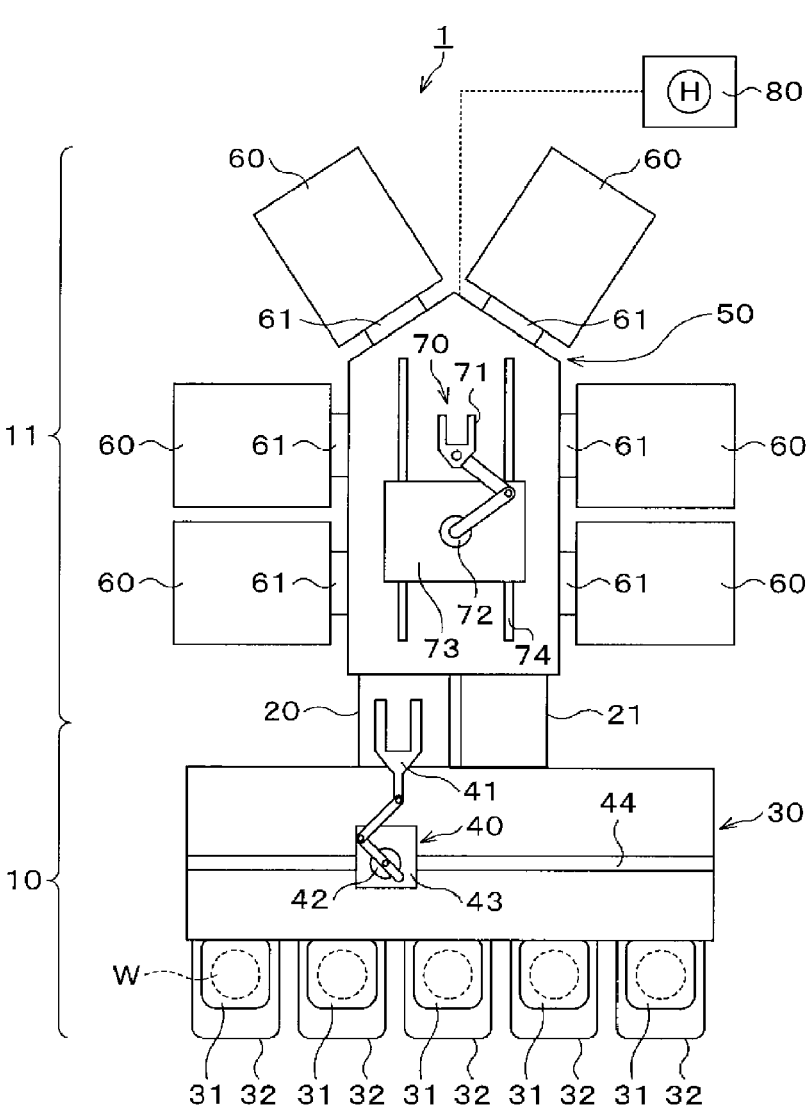
FIG. 1 is a plan view illustrating a schematic configuration of a wafer processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In a manufacturing process for a semiconductor device, plasma is formed by exciting a processing gas, and a semiconductor wafer (hereinafter, simply referred to as "wafer") is processed by the plasma. Specifically, this plasma processing is performed in the state that the wafer is held on a placing table provided within a chamber.

When the plasma processing is performed, a temperature of the wafer needs to be adjusted depending on a target processing such as an etching processing, a film forming processing, or a diffusing processing. For the purpose, a cooling medium (hereinafter, referred to as "coolant") is supplied into the placing table from a chiller, for example, to thereby adjust the temperature of the placing table.

Recently, there is a demand for reducing a footprint (occupied area) of the chiller by downsizing it. However, the conventional chiller as disclosed in Patent Document 1, for example, could not be scaled down. That is, when a maintenance of, for example, replacing the placing table or replacing the chiller is performed, the coolant remaining in the placing table or the chiller needs to be collected. For the purpose, the conventional chiller has a collection tank for collecting the coolant. Due to the presence of this collection tank, the size of the chiller could not be reduced even though the mentioned maintenance is not often conducted.

Further, it is recently required to improve a coolant processing performance in the chiller, for example, to improve a coolant supplying performance and a coolant collecting performance. To meet such a requirement, the size of the chiller is increased. That is, there is a trade-off relationship between the processing performance of the chiller and the downsizing thereof. Thus, it has been difficult to reduce the size of the chiller while maintaining the processing performance thereof.

The present disclosure provides a technique capable of downsizing a chiller module while maintaining a processing performance of a temperature control medium in the chiller module. Hereinafter, a coolant processing apparatus as a temperature control medium processing apparatus and a coolant processing method as a temperature control medium processing method according to an exemplary embodiment will be described with reference to the accompanying drawings. In the present specification and the drawings, parts having substantially same functions and configurations will be assigned same reference numerals, and redundant description will be omitted.

<Wafer Processing Apparatus>

First, a wafer processing apparatus equipped with a coolant processing apparatus according to the exemplary embodiment will be explained. FIG. 1 is a plan view illustrating a schematic configuration of a wafer processing apparatus 1 according to the exemplary embodiment. The wafer processing apparatus 1 performs a processing such as an etching processing, a film forming processing or a diffusing processing on a wafer W as a substrate.

As depicted in FIG. 1, the wafer processing apparatus 1 includes an atmospheric section 10 and a decompressed section 11 connected as one body with load lock modules 20 and 21 therebetween. The atmospheric section 10 is equipped with an atmospheric module configured to perform a required processing on the wafer W in an atmospheric atmosphere. The decompressed section 11 is equipped with a decompressed module configured to perform a required processing on the wafer W in a decompressed atmosphere.

The load lock modules 20 and 21 are configured to connect a loader module 30 of the atmospheric section 10 to be described later and a transfer module 50 of the decompressed section 11 to be described later with gate valves (not shown) therebetween. Each of the load lock modules 20 and 21 is configured to hold the wafer W temporarily. Further, each of the load lock modules 20 and 21 is configured such that an inside thereof is switched between the atmospheric atmosphere and the decompressed atmosphere (vacuum state).

The atmospheric section 10 includes the loader module 30 equipped with a wafer transfer device 40 to be described later; and load ports 32 on which FOUPs 31 each of which is capable of accommodating a plurality of wafers W therein are to be placed. Further, an orienter module (not shown) configured to adjust a direction of the wafer W in a horizontal direction, a storage module (not shown) configured to store a plurality of wafers W therein, or the like may be provided adjacent to the loader module 30.

The loader module 30 is implemented by a housing having a rectangular inside, and the inside of the housing is maintained in the atmospheric atmosphere. A multiple number of, for example, five load ports 32 are arranged at one long side of the housing of the loader module 30. The load lock modules 20 and 21 are arranged at the other long side of the housing of the loader module 30.

The wafer transfer device 40 configured to transfer the wafer W is provided within the loader module 30. The wafer transfer device 40 is equipped with a transfer arm 41 configured to be moved while holding the wafer W thereon; a rotary table 42 supporting the transfer arm 41 in a rotatable manner; and a rotary stage 43 on which the rotary table 42 is placed. Further, a guide rail 44 extending in a lengthwise direction of the loader module 30 is provided within the loader module 30. The rotary stage 43 is provided on the guide rail 44, and the wafer transfer device 40 is configured to be moved along the guide rail 44.

The decompressed section 11 has a transfer module 50 configured to transfer the wafer W; and processing modules 60 each configured to perform a required processing on the wafer W transferred from the transfer module 50. Insides of the transfer module 50 and the processing modules 60 are maintained in the decompressed atmosphere. A plurality of, e.g., six processing modules 60 are provided for the single transfer module 50. Further, the number and the layout of the processing modules 60 are not limited to the example of the present exemplary embodiment, and may be selected as required.

The transfer module 50 is implemented by a housing having a polygonal (pentagonal in the shown example) inside, and is connected to the load lock modules 20 and 21 as mentioned above. The transfer module 50 transfers the wafer W carried from the load lock module 20 into one of the processing modules 60. Then, after the required processing is performed on the wafer W, the transfer module 50 carries the wafer W into the atmospheric section 10 via the load lock module 21.

Each of the processing modules 60 is configured to perform a processing such as an etching processing, a film forming processing or a diffusion processing. Any of various modules configured to perform various target processings for the wafer may be selected as the processing modules 60. Further, the processing modules 60 are connected to the transfer module 50 via gate valves 61.

In the processing module 60, though not shown, in the state that the wafer W is placed on a placing table provided within a chamber, a high frequency power is supplied to a lower electrode of the placing table while a processing gas is supplied into the chamber from an upper electrode shower head. Plasma is formed by exciting the processing gas, and a required processing is performed on the wafer W by this plasma. Further, a coolant path through which a coolant as a temperature control medium flows is formed within the placing table of the processing module 60, and a chiller module 100 to be described later is connected to this coolant path. Furthermore, the wafer processing apparatus 1 is equipped with a coolant processing apparatus 200 as a temperature control medium processing apparatus configured to collect the coolant from the chiller module 100 and the processing module 60 and to replenish them with the coolant. As the coolant is supplied from the chiller module 100 into the placing table, a temperature of the placing table is adjusted. By way of non-limiting example, brine is used as the coolant.

A wafer transfer device 70 configured to transfer the wafer W is provided within the transfer module 50. The wafer transfer device 70 is equipped with a transfer arm 71 configured to be moved while holding the wafer W thereon; a rotary table 72 supporting the transfer arm 71 in a rotatable manner; and a rotary stage 73 on which the rotary table 72 is placed. Further, a guide rail 74 extending in a lengthwise direction of the transfer module 50 is provided within the transfer module 50. The rotary stage 73 is provided on the guide rail 74, and the wafer transfer device 70 is configured to be moved along the guide rail 74.

In the transfer module 50, the wafer W held in the load lock module 20 is received by the transfer arm 71 and transferred into the processing module 60. Further, the wafer W after being subjected to the required processing is held by the transfer arm 71 and carried into the load lock module 21.

The above-described wafer processing apparatus 1 is equipped with a controller 80. The controller 80 is implemented by a computer having, for example, a CPU and a memory, and includes a program storage (not shown). A program for controlling a processing upon the wafer W in the wafer processing apparatus 1 is stored in the program storage. Further, the program may be recorded in a computer-readable recording medium and installed from this recording medium to the controller 80.

Now, a wafer processing performed by the wafer processing apparatus 1 having the above-described configuration will be explained.

First, the FOUP 31 accommodating the wafers W therein is placed on the load port 32.

Then, the wafer W is taken out from the FOUP 31 and carried into the load lock module 20 by the wafer transfer device 40. Once the wafer W is carried into the load lock module 20, the inside of the load lock module 20 is hermetically sealed to be decompressed. Then, the inside of the load lock module 20 and the inside of the transfer module 50 are allowed to communicate with each other.

Thereafter, the wafer W is held by the wafer transfer device 70 and transferred into the transfer module 50 from the load lock module 20.

Subsequently, the gate valve 61 is opened, and the wafer W is carried into the processing module 60 by the wafer transfer device 70. Then, the gate valve 61 is closed, and a required processing is performed on the wafer W in the processing module 60. That is, the wafer W is placed on the placing table to be attracted to and held by the placing table. At this time, the coolant is supplied from the chiller module 100 into the placing table, so that the temperature of the placing table and a temperature of the wafer W are adjusted. Then, by supplying the high frequency power to the lower electrode while supplying the processing gas into the chamber, the processing gas is excited into the plasma, and the wafer W is plasma-processed.

Next, the gate valve 61 is opened, and the wafer W is taken out from the processing module 60 by the wafer transfer device 70. Then, the gate valve 61 is closed.

Afterwards, the wafer W is carried into the load lock module 21 by the wafer transfer device 70. Once the wafer W is carried into the load lock module 21, the inside of the load lock module 21 is hermetically sealed and opened to the atmosphere. Then, the inside of the load lock module 21 and the inside of the loader module 30 are allowed to communicate with each other.

Then, the wafer W is held by the wafer transfer device 40, and carried from the load lock module 21 back into the FOUP 31 via the loader module 30 to be accommodated in the FOUP 31 again. Through these operations, the series of processes of the wafer processing in the wafer processing apparatus 1 are completed.

<Chiller Module and Coolant Processing Apparatus>

Figure 2:
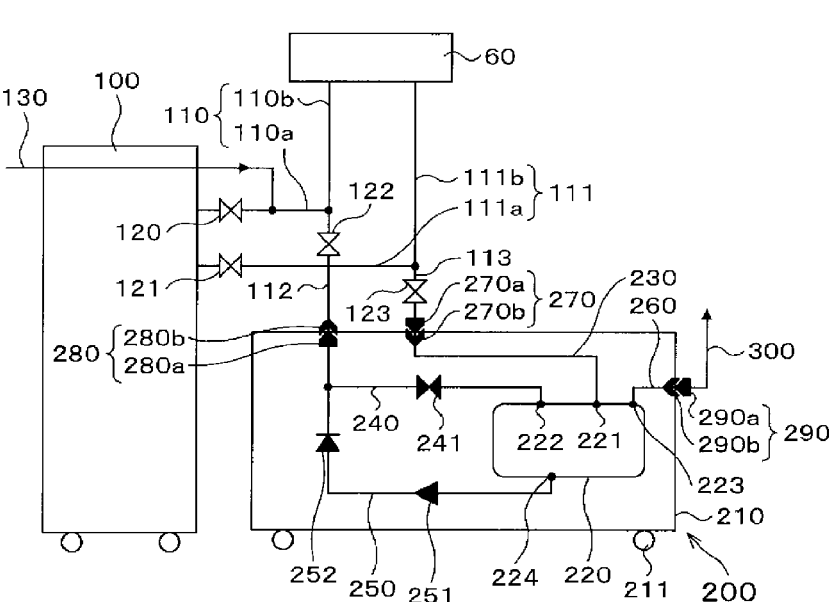
FIG. 2 is an explanatory diagram illustrating a schematic configuration of a processing module, a chiller module and a coolant processing apparatus.

Now, the chiller module 100 and the coolant processing apparatus 200 will be described. FIG. 2 is an explanatory diagram illustrating a schematic configuration of the processing module 60, the chiller module 100 and the coolant processing apparatus 200.

As depicted in FIG. 2, the chiller module 100 has a chiller configured to supply the coolant into the placing table of the processing module 60. The chiller module 100 is disposed under the processing module 60. The chiller of the present exemplary embodiment is, for example, a single chiller, and it serves to adjust a temperature of the coolant to a required temperature and supply the temperature-adjusted coolant into the placing table. The temperature of the placing table is adjusted by the coolant supplied from the chiller module 100, and the coolant after being used in the temperature adjustment is then returned back into the chiller module 100. In this way, by circulating the coolant between the chiller module 100 and the processing module 60, the temperature of the placing table is adjusted.

The coolant processing apparatus 200 is configured to collect the coolant from the chiller module 100 and the processing module 60. Further, the coolant processing apparatus 200 is configured to fill the coolant into the chiller module 100 and the processing module 60. The coolant processing apparatus 200 is disposed under the processing module 60, and placed on the same floor as the chiller module 100. Further, since the coolant is circulated between the chiller module 100 and the processing module 60 as stated above, the coolant processing apparatus 200 is not operated in a typical wafer processing. By way of example, in a process other than the wafer processing, such as in maintenance of the processing module or the chiller module 100 or when starting the processing module 60 or the chiller module 100, the coolant processing apparatus 200 is connected to the processing module 60 and the chiller module 100.

Circulation paths 110 and 111 through which the coolant is circulated are connected between the chiller module 100 and the processing module 60. The first circulation path 110 is a path through which the coolant is supplied into the processing module 60 from the chiller module 100. The second circulation path 111 is a path through which the coolant is returned back into the chiller module 100 from the processing module 60.

The first circulation path 110 is connected with one end of a first connection path 112 which is coupled to the coolant processing apparatus 200. A female coupler 280*b* of an outlet coupler 280 to be described later is provided at the other end of the first connection path 112. The second circulation path 111 is connected with one end of a second connection path 113 which is coupled to the coolant processing apparatus 200. A male coupler 270*a* of an inlet coupler 270 to be described later is provided at the other end of the second connection path 113.

Further, in the following description, a portion of the first circulation path 110 at the upstream of the first connection path 112 will sometimes be referred to as a first circulation path 110*a*, and a portion of the first circulation path 110 at the downstream of the first connection path 112 will sometimes be referred to as a first circulation path 110*b*. Further, a portion of the second circulation path 111 at the upstream of the second connection path 113 will sometimes be referred to as a second circulation path 111*a*, and a portion of the second circulation path 111 at the downstream of the second connection path 113 will sometimes be referred to as a second circulation path 111*b*.

The first circulation path 110*a*, the second circulation path 111*a*, the first connection path 112 and the second connection path 113 are provided with a valve 120, a valve 121, a valve 122 and a valve 123, respectively. The valves 120 to 123 may be, by way of non-limiting example, ball valves.

Further, an air path 130 through which dry air is supplied into the circulation paths 110 and 111 is connected to a portion of the first circulation path 110*a* at the downstream of the valve 120. The air path 130 is connected to an air supply source (not shown) which force-feeds the dry air.

The coolant processing apparatus 200 is equipped with a housing 210 and a moving device 211 configured to move the housing 210. The moving device 211 has vehicle wheels provided on a bottom surface of the housing 210, and is configured to be moved by an operator. However, a configuration of the moving device 211 is not limited to the example of the present exemplary embodiment. By way of example, the moving device 211 may be equipped with a driving unit having a motor therein and be configured to be self-propelled.

A tank 220, a first inlet path 230, a second inlet path 240, an outlet path 250 and an exhaust path 260 are accommodated within the housing 210. Further, the housing 210 is equipped with the inlet coupler 270 as an inlet connector, the outlet coupler 280 as an outlet connector, and an exhaust coupler 290 as an exhaust connector.

The tank 220 stores the coolant therein. The tank 220 is configured to store the coolant therein when the coolant is collected from the chiller module 100, the processing module 60, the circulation paths 110 and 111, and the connection paths 112 and 113. Here, since the conventional chiller incorporates therein a large-volume tank for collecting the coolant, this conventional chiller could not be downsized. In the present exemplary embodiment, however, since the tank 220 is provided at an outside of the chiller module 100, the chiller module 100 can be downsized, and the footprint thereof can be reduced.

A first inlet opening 221 and a second inlet opening 222 through which the coolant is introduced into the tank 220 and an exhaust opening 223 through which a gas within the tank 220 is exhausted are formed at a top surface of the tank 220. Further, an outlet opening 224 through which the coolant within the tank 220 flows out is formed at a bottom surface of the tank 220.

One end of the first inlet path 230 is connected to the first inlet opening 221, and the other end thereof is connected to a female coupler 270b of the inlet coupler 270 to be described later. The first inlet opening 221 is provided under the female coupler 270b, and the coolant flows downwards from an upper side to a lower side within the first inlet path 230 in overall.

One end of the second inlet path 240 is connected to the second inlet opening 222, and the other end thereof is connected to the outlet path 250. The second inlet opening 222 is provided at a position under a joint position where the second inlet path 240 is connected to the outlet path 250. Accordingly, in overall, the coolant flows downwards from the upper side toward the lower side within the second inlet path 240. The second inlet path 240 is provide with a valve 241. As an example, a ball valve may be used as the valve 241.

One end of the outlet path 250 is connected to the outlet opening 224, and the other end of the outlet path 250 is connected to a male coupler 280a of the outlet coupler 280 to be described later. The outlet opening 224 is provided under the male coupler 280a. The outlet path 250 is provided with a pump 251 configured to force the coolant stored in the tank 220 to flow out. By operating the pump 251, the coolant flows upwards in the outlet path 250 from the lower side toward the upper side in overall. Further, the pump 251 is connected with a power supply (not shown) configured to operate the pump 251. The power supply is accommodated within, for example, the housing 210. Since the pump 251 is battery-operated by the power supply, an additional power source is not required.

Furthermore, the outlet path 250 is also provided with, at the downstream of the pump 251, a check valve 252 configured to allow the temperature control medium to flow in one direction, that is, toward the downstream side. This check valve 252 suppresses the coolant from flowing toward the pump 251, thus suppressing a damage on the pump 251.

One end of the exhaust path 260 is connected to the exhaust opening 223, and the other end thereof is connected to a female coupler 290b of the exhaust coupler 290 to be described later. Connected to a male coupler 290a of the exhaust coupler 290 is an external exhaust path 300 provided at an outside of the housing 210. Further, the chiller module 100 is provided with an exhaust path (not shown) for exhausting a gas within the chiller, and the external exhaust path 300 may be connected to this exhaust path.

Within the tank 220, the coolant stored therein may be volatilized. Further, when the coolant is collected from the chiller module 110 and the processing module 60 as will be described later, the dry air is supplied from the air path 130 to be introduced into the tank 220. These gases including the volatilized coolant and the dry air are exhausted via the exhaust path 260 and appropriately processed by a harm removing apparatus or the like provided at an outside of the coolant processing apparatus 200.

The inlet coupler 270 has the male coupler 270a and the female coupler 270b; the outlet coupler 280, the male coupler 280a and the female coupler 280b; and the exhaust coupler 290, the male coupler 290a and the female coupler 290b. By inserting the male couplers 270a, 280a and 290a into the female couplers 270b, 280b and 290b, respectively, the couplers 270, 280 and 290 are set into a connected state. Meanwhile, in the state that the male couplers 270a, 280a and 290a are not inserted in the female couplers 270b, 280b and 290b, respectively, the male couplers 270a, 280a and 290a and the female couplers 270b, 280b and 290b are in a closed state.

Further, so-called quick couplers are used as the couplers 270, 280 and 290, and the male couplers 270a, 280a and 290a can be inserted into the female couplers 270b, 280b and 290b by one touch. Thus, the connection of each of the couplers 270, 280 and 290 can be performed easily without needing to use a tool or a gasket additionally.

In the inlet coupler 270, the female coupler 270b is provided at a top surface of the housing 210, and the male coupler 270a is provided at the other end of the second connection path 113. In the outlet coupler 280, the male coupler 280a is provided at the top surface of the housing 210, and the female coupler 280b is provided at the other end of the first connection path 112. In the exhaust coupler 290, the female coupler 290b is provided at a side surface of the housing 210, and the male coupler 290a is provided at one end of the external exhaust path 300.

That is, the couplers 270, 280 and 290 are respectively provided at all the portions of the housing 210 in contact with the outside air. With this configuration, a leak of the coolant within the housing 210 to the outside can be suppressed.

As stated above, the male/female arrangements of the inlet coupler 270 and the outlet coupler 280 in the housing 210 are reserve. Accordingly, it never happens that the male coupler 270a and the male coupler 280a are connected. Therefore, a wrong connection between the second connection path 113 and the outlet path 250 can be prevented. Likewise, since the female coupler 270b and the female coupler 280b are never connected, a wrong connection between the first connection path 112 and the first inlet path 230 can be prevented.

Meanwhile, the male/female arrangements of the inlet coupler 270 and the exhaust coupler 290 at the housing 210 are identical. Here, even if the male coupler 270a and the female coupler 290b are wrongly connected, the coolant is introduced into the tank 220 from the second connection path 113 via the exhaust path 260, resulting in no substantial damage. Further, even if the male coupler 290a and the female coupler 270b are wrongly connected, the gas within the tank 220 is exhausted into the exhaust path 300 via the first inlet path 230, resulting in no substantial damage, either. Thus, the male/female arrangements of the inlet coupler 270 and the exhaust coupler 290 in the housing 210 may be identical.

Moreover, the male/female arrangements of the couplers 270, 280 and 290 in the housing 210 may be reverse to the present exemplary embodiment. That is, the male coupler 270a, the female coupler 280b and the male coupler 290a may be respectively provided at the housing 210.

<Collecting Method>

Now, a method of collecting the coolant from the chiller module 100 and the processing module 60 by using the coolant processing apparatus 200 having the above-described configuration will be discussed. For example, when performing maintenance of the chiller module 100 and the processing module 60, operations of the chiller module 100 and the processing module 60 are stopped, and the coolant within the chiller module 100, the processing module 60, the circulation paths 110 and 111, and the connection paths 112 and 113 is collected.

Figure 3A:
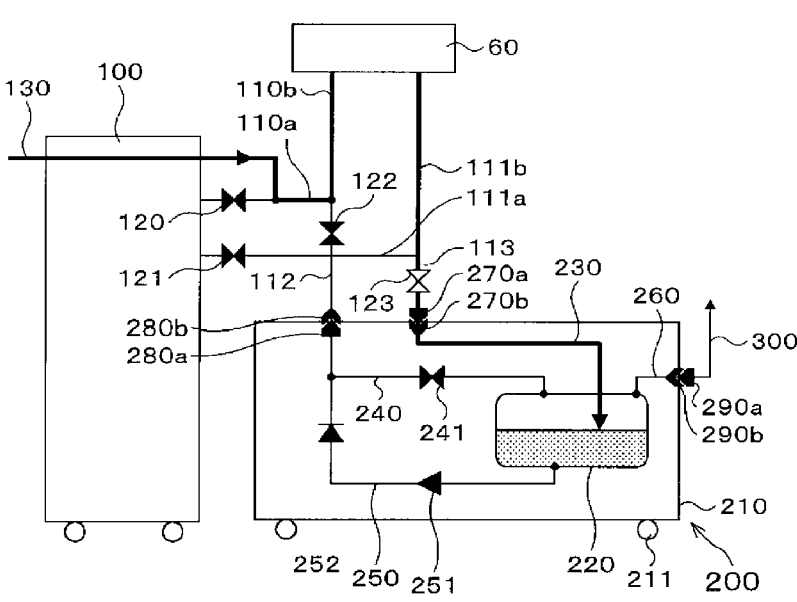
FIG. 3A and FIG. 3B are explanatory diagrams illustrating a method of collecting a coolant from the chiller module and the processing module.
Figure 3B:
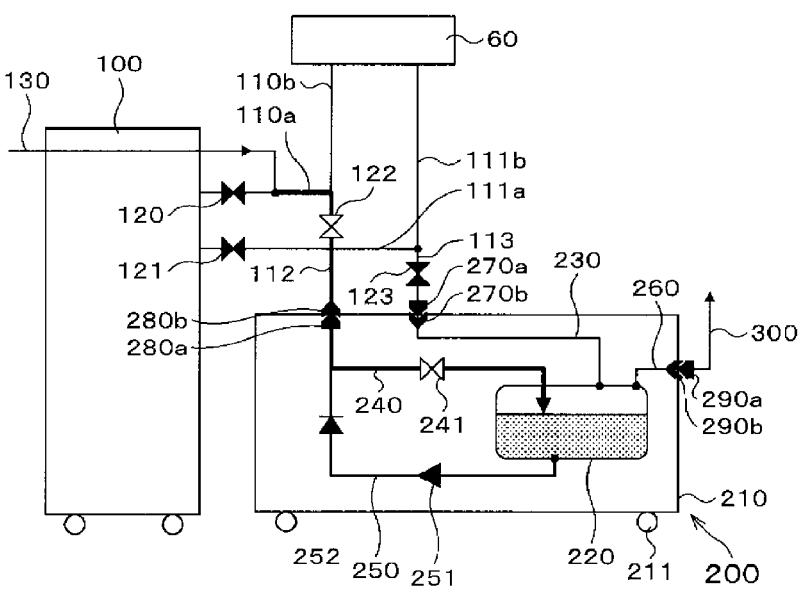

FIG. 3A and FIG. 3B are explanatory diagrams illustrating the method of collecting the coolant from the chiller module 100 and the processing module 60. In FIG. 3A and FIG. 3B, among the valves 120, 121, 122, 123 and 241, those marked white are open (OPEN), whereas those marked black are closed (CLOSE). Further, among the paths 110, 111, 112, 113, 230, 240 and 250, those marked by bold lines indicate that the coolant flows therein.

First, as depicted in FIG. 3A, in the respective couplers 270, 280 and 290, by inserting the male couplers 270a, 280a and 290a into the female couplers 270b, 280b and 290b, respectively, the couplers 270, 280 and 290 are set into the connected state. Then, the second connection path 113 and the first inlet path 230 are connected via the inlet coupler 270; the first connection path 112 and the outlet path 250 are connected via the outlet coupler 280; and the external exhaust path 300 and the exhaust path 260 are connected via the exhaust coupler 290.

Subsequently, in the state that the valves 120, 121, 122 and 241 are closed, the valve 123 is opened. Then, the dry air is supplied into the first circulation path 110a from the air path 130. This dry air allows the coolant within the first circulation paths 110a and 110b, the placing table of the processing module 60, the second circulation path 111b and the second connection path 113 to flow through the first inlet path 230 into the tank 220 to be collected therein. At this time, the gases within the tank 220, that is, the dry air and the volatilized coolant are exhausted through the exhaust path 260 and the external exhaust path 300.

Since the chiller module 100 is provided under the processing module 100 as stated above, the coolant still exists within, for example, the connection path 112 even if the coolant is collected by supplying the dry air, as illustrated in FIG. 3A.

Here, as a next process, in the state that the valves 120 and 121 are closed, the valve 123 is closed, and the valves 122 and 241 are opened, as illustrated in FIG. 3B. At this time, the supply of the dry air from the air path 130 is stopped. Accordingly, the coolant within the first circulation path 110a and the first connection path 112 falls down due to its weight, and is collected into the tank 220 through the inlet path 240. At this time as well, the gas within the tank 220, that is, the volatilized coolant is exhausted through the exhaust path 260 and the external exhaust path 300.

As stated above, the coolant within the chiller module 100, the processing module 60, the circulation paths 110 and 111 and the connection paths 112 and 113 is all collected into the tank 220.

According to the above-described exemplary embodiment, since the tank 220 configured to collect the tank 220 is provided at the outside of the chiller module 100, the chiller module 100 can be sized down, and the footprint thereof can be reduced. Further, since the chiller module 100 itself is prepared only by omitting the collection tank for the coolant, which is conventionally provided in the chiller, and disposing the collection tank at the outside thereof, the chiller module 100 maintains the processing performance of adjusting the temperature of the coolant and supplying the temperature-adjusted coolant.

Furthermore, unlike in the conventional case, since the collection tank need not be accommodated in the chiller and the tank 220 is provided at the outside of the chiller module 100, a storage capacity of the tank 220 for the coolant can be sufficiently secured. For example, even if an amount of the coolant exceeds a collectable amount on a specification, the coolant can still be all collected into the tank 220.

Moreover, if the coolant processing apparatus 200 is used, the coolant can be all collected just by setting the couplers 270, 280 and 290 into the connected state and manipulating the opening/closing of the valves 120, 121, 122, 123 and 241. Thus, the collection of the coolant is eased, and a work time can be shortened.

Further, although the conventional chiller has the coolant collection tank mounted thereto, this collection tank may be distanced far from the processing module 60 depending on an installation place of the chiller. In such a case, the circulation path for the coolant is lengthened, so that the coolant within this circulation path may not be all collected. Thus, in such a case, a work of extracting the residual coolant which is not collected yet needs to be further performed before the coolant is collected into the collection tank. In the present exemplary embodiment, however, the coolant processing apparatus 200 is configured to be movable, and distances from the chiller module 100 and the processing module 60 are maintained constant. Thus, the aforementioned work of extracting the residual coolant is not required, so that a time required for the collection of the coolant can be shortened.

In addition, in case of extracting the residual coolant as in the conventional case, there is a concern that the coolant may leak. If brine is used as the coolant, this coolant has volatility and may have an influence upon a human body. Further, if the coolant leaks, a gas detector in a factory in which the wafer processing apparatus 1 is placed may be wrongly operated, causing an operation within the factory to be stopped. In the present exemplary embodiment, however, since the work of extracting the remaining coolant is not necessary, the leak of the coolant to the outside can be suppressed.

Furthermore, the couplers 270, 280 and 290 are provided at all the portions in contact with the outside air. Accordingly, the leak of the coolant within the housing 210 to the outside can be prevented. With this configuration, it is possible to suppress the leak of the coolant from the housing 210, which might occur when the collection of the coolant by the coolant processing apparatus 200 is not performed. In addition, the leak of the coolant may be caused in the conventional chiller because the operator has forgotten to close the valve, for example. In the present exemplary embodiment, the leak of the coolant for this reason can also be suppressed.

Moreover, the conventional chiller is provided with a special interlock to suppress the leak of the coolant. To elaborate, the conventional chiller is equipped with a pressure gauge configured to measure an internal pressure of a receptacle in which the coolant is stored, and/or a gas detector configured to detect a leak of the volatilized coolant. Since, however, the coolant processing apparatus 200 of the present exemplary embodiment is capable of suppressing the leak of the coolant, the aforementioned special interlock is not needed.

Additionally, the male/female arrangements of the inlet coupler 270 and the outlet coupler 280 in the housing 210 are reverse. Thus, since it never happens that the male coupler 270a and the male coupler 280a are connected, the wrong connection between the second connection path 113 and the outlet path 250 can be prevented. Likewise, since the female coupler 270b and the female coupler 280b are never connected to each other, the wrong connection between the first connection path 112 and the first inlet path 230 can be prevented.

Furthermore, since each of the couplers 270, 280 and 290 is implemented by the so-called quick coupler, the setting each of the couplers 270, 280 and 290 into the connected state can be easily performed without needing to use an additional tool or gasket.

Moreover, since the pump 251 is battery-operated by the power source, an additional power source is not required wherever it is used. Further, a jig for use in injecting air as in the conventional case is not necessary, either.

Further, the coolant processing apparatus 200 has the moving device 211 and is configured to be movable. Therefore, the coolant processing apparatus 200 can access any chiller module 100 and any processing module 60. For example, the single coolant processing apparatus 200 may be shared by a multiple number of chiller modules 100 and a multiple number of processing modules 60.

Furthermore, in the above-described exemplary embodiment, after the coolant within the first circulation paths 110a and 110b, the placing table of the processing module 60, the second circulation path 111b and the second connection path 113 is collected by the dry air as illustrated in FIG. 3A, the coolant within the first circulation path 110a and the first connection path 112 is collected as illustrated in FIG. 3B. However, the order of the collection of the coolant shown in FIG. 3A and the collection of the coolant in FIG. 3B may be reversed.

In addition, in the above-described exemplary embodiment, since the chiller module 100 is disposed under the processing module 60, the collection of the coolant shown in FIG. 3B is needed. If, however, the chiller module 100 is provided at the same height as the processing module 60, for example, the collection of the coolant shown in FIG. 3B may be omitted.

Further, in the above-described exemplary embodiment, by opening the valve 241 as shown in FIG. 3B, the coolant within the first circulation path 110a and the first connection path 112 is collected. However, the second inlet path 240 and the valve 241 may be omitted, and the first connection path 112 and the second connection path 113 may be connected, for example. In such a case, the coolant within the first circulation path 110a and the first connection path 112 is collected into the tank 220 via the second connection path 113 and the first inlet path 230.

<Refilling Method>

Now, a method of refilling the chiller module 100 and the processing module 60 with the coolant collected into the tank 220 of the coolant processing apparatus 200 will be explained. For example, this refilling is performed after the maintenance of the chiller module 100 and the processing module 60 is completed.

Figure 4:
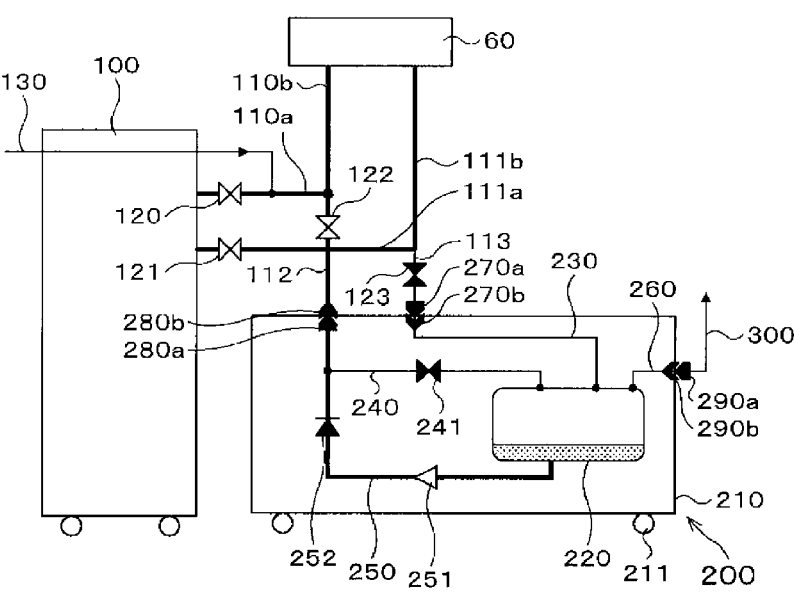
FIG. 4 is an explanatory diagram illustrating a method of refilling the chiller module and the processing module with the coolant collected by the coolant processing apparatus.

FIG. 4 is an explanatory diagram illustrating the method of refilling the chiller module 100 and the processing module 60 with the coolant collected by the coolant processing apparatus 200. In FIG. 4, among the valves 120, 121, 122, 123 and 241, those marked white are open (OPEN), while those marked black are closed (CLOSE). Further, among the paths 110, 111, 112, 113, 230, 240 and 250, those marked by bold lines indicate that the coolant flows therein.

First, as depicted in FIG. 4, in the respective couplers 270, 280 and 290, the male couplers 270a, 280a and 290a are inserted into the female couplers 270b, 280b and 290b, respectively, so that the couplers 270, 280 and 290 are turned into the connected state.

Subsequently, in the state that the valves 123 and 241 are closed, the valves 120, 121 and 122 are opened. Then, by operating the pump 251, the coolant stored in the tank 220 flows out. The coolant from the tank 220 flows into the first circulation path 110, the placing table of the processing module 60, the second circulation path 111 and the chiller module 100 via the outlet path 250 and the first connection path 112 to refill them.

Further, the coolant stored in the tank 220 has a room temperature. After the refilling of the coolant is completed as described above, the chiller module 100 is operated, and the temperature-adjusted coolant is supplied into the placing table of the processing module 60.

According to the above-described exemplary embodiment, the same effects as described above in the method of collecting the coolant can be achieved. Particularly, the coolant processing apparatus 200 according to the present exemplary embodiment is capable of performing the refilling of the coolant of the present exemplary embodiment as well as the above-described collection of the coolant.

Further, in the conventional chiller, a replenishment opening for use in replenishing the coolant is provided at a high position. If the replenishment opening is provided at a low position, the coolant may leak when this replenishment opening is opened. Particularly, since the size of the chiller is increased with a recent progress of multi-channel thereof, the replenishment opening tends to be located at a higher position. Furthermore, since the position of the replenishment opening is high, the coolant needs to be moved into a small-capacity receptacle, for example, an oil jug and replenished into the replenishment opening from this receptacle, even though the capacity of the coolant supply can storing the coolant therein is large. In such a case, it takes time to move the coolant, so that a time required for the refilling is lengthened. Further, there is also a concern that the coolant may leak when it is moved.

Moreover, there may be considered a method of replenishing the coolant by using, for example, a jig configured to force-feed the coolant by using dry air. In such a case, however, the dry air becomes a requisite, so that a place to be refilled is limited to a particular place. Further, though the replenishment of the coolant can be conducted, the collection of the coolant cannot be carried out.

In the present exemplary embodiment, however, by operating the pump 251, the coolant can be refilled. Thus, unlike in the conventional case, the coolant need not be moved, so that the processing time can be reduced. Further, the leak of the coolant can be suppressed.

Further, if the coolant processing apparatus 200 is used, the refilling of the coolant can be accomplished just by connecting the couplers 270, 280 and 290 and manipulating the opening/closing of the valves 120, 121, 122, 123 and 241. Therefore, the work of refilling with the coolant becomes very easy, and the work time can be shortened.

<Filling Method>

In the above-described exemplary embodiment, the chiller module 100 and the processing module 60 are refilled with the coolant collected by the tank 220. However, when the refilling of the coolant is required, the coolant may not be stored in the tank 220. Particularly, when the operations of the processing module 60 and the chiller module 100 are begun, for example, the coolant is not stored in the tank 220. Further, when the filling of the coolant is needed because of the volatilization of the coolant collected by the tank 220, the coolant stored in the tank 220 may be lacking. In such a case, the coolant stored in the external coolant supply source may be filled into the chiller module 100 and the processing module 60. In the following description, such a method of filling the coolant will be explained.

Figure 5:
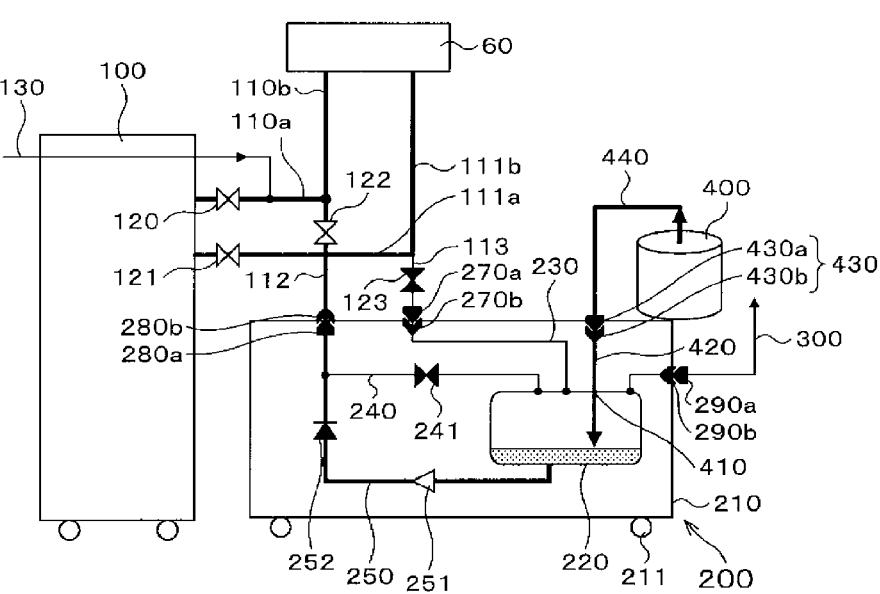
FIG. 5 is an explanatory diagram illustrating a method of filling the chiller module and the processing module with the coolant stored in a coolant supply source by using the coolant processing apparatus.

FIG. 5 is an explanatory diagram illustrating a method of filling the chiller module 100 and the processing module 60 with the coolant stored in the coolant supply source 400 by using the coolant processing apparatus 200. In FIG. 5, among the valves 120, 121, 122, 123 and 241, those marked white are open (OPEN), whereas those marked black are closed (CLOSE). Further, among the paths 110, 111, 112, 113, 230, 240 and 250, those marked by bold lines indicate that the coolant flows therein.

In performing the method of filling the coolant according to the present exemplary embodiment, the coolant processing apparatus 200 needs a configuration for receiving the coolant from the coolant supply source 400 in addition to the configuration of the above-described exemplary embodiment.

In the coolant processing apparatus 200 according to the present exemplary embodiment, a supply opening 410 through which the coolant is supplied into the tank 220 is formed at the top surface of the tank 220. A supply path 420 is provided within the housing 210, and the housing 210 is equipped with a supply coupler 430 as a supply connector.

One end of the supply path 420 is connected to the supply opening 410, and the other end thereof is connected to a female coupler 430*b* of the supply coupler 430 to be described later. A male coupler 430*a* of the supply coupler 430 is connected to an external supply path 440 which is connected to the coolant supply source 400.

The supply coupler 430 has the same configuration as the couplers 270, 280 and 290, and has the male coupler 430*a* and the female coupler 430*b*. Further, a so-called quick coupler is used as the supply coupler 430. By inserting the male coupler 430*a* into the female coupler 430*b* by one touch, the supply coupler 430 is turned into the connected state. In the supply coupler 430, the female coupler 430*b* is provided at the top surface of the housing 210, and the male coupler 430*a* is provided at one end of the external supply path 440.

Now, the method of filling the chiller module 100 and the processing module 60 with the coolant from the coolant supply source 400 by using the above-described coolant processing apparatus 200 will be discussed.

First, as depicted in FIG. 5, in the respective couplers 270, 280, 290 and 430, the male couplers 270*a*, 280*a*, 290*a* and 430*a* are respectively inserted into the female couplers 270*b*, 280*b*, 290*b* and 430*b*, so that the couplers 270, 280, 290 and 430 are turned into the connected state. Then, the coolant supply source 400 is connected to the external supply path 440.

Then, in the state that the valves 123 and 241 are closed, the valves 120, 121 and 122 are opened. Next, the pump 251 is operated. As a result, the internal pressure of the tank 220 decreases, and the coolant is introduced from the coolant supply source 400 into the tank 220 via the external supply path 440 and the supply path 420. Further, the pump 251 is operated to force the coolant stored in the tank 220 to flow out. The coolant from the tank 220 is filled into the first circulation path 110, the placing table of the processing module 60, the second circulation path 111 and the chiller module 100 via the outlet path 250 and the first connection path 112.

According to the above-described exemplary embodiment, the same effects as described in the method of refilling the coolant can be achieved.

Other Exemplary Embodiments

Although the single chiller is used as the chiller of the chiller module 100 according to the above-described exemplary embodiment, the coolant processing apparatus 200 can still be used even when a dual chiller is used. In the dual chiller, two kinds of coolants having different temperatures are mixed to produce a temperature-adjusted coolant. For the chiller module 100 equipped with this dual chiller as well, the collection of the coolant or the filling of the coolant can be performed by using the coolant processing apparatus 200.

The chiller of the chiller module 100 according to the above-described exemplary embodiment serves to supply the coolant into the placing table of the processing module 60. However, the coolant processing apparatus 200 can still be used even in a configuration where the coolant is supplied to the upper electrode shower head. For the chiller module 100 having this chiller as well, it is possible to perform the collection of the coolant or the filling of the coolant by using the coolant processing apparatus 200.

In the above-described exemplary embodiment, the single coolant processing apparatus 200 is provided for the multiple number of chiller modules 100 and the multiple number of processing modules 60. However, a plurality of coolant processing apparatuses 200 may be provided. In such a case, even if the coolant is stored in the tank 220 of one of the plurality of coolant processing apparatuses 200, the coolant can be collected from the chiller module 100 and the processing module 60 by using another coolant processing apparatus 200. Furthermore, when the processings performed in the plurality of processing modules 60 are different, the kinds of coolants required in the respective processing modules 60 may be different. In such a case, if the plurality of coolant processing apparatuses 200 corresponding these coolants individually are provided, they can correspond to the respective processing modules 60.

After performing the collection of the coolant according to the above-described exemplary embodiment, a coolant collecting receptacle (not shown) provided at an outside of the coolant processing apparatus 200 may be used to further collect the coolant stored in the tank 220. A path provided with the female coupler 280*b* of the outlet coupler 280 is connected to this coolant collecting receptacle. If the method of filling the coolant shown in FIG. 4 and FIG. 5 is performed after the male coupler 280*a* is inserted into this female coupler 280*b*, the coolant stored in the tank 220 is collected into the coolant collecting receptacle. In this case, by using the single coolant processing apparatus 200, it is possible to collect the coolant from the multiple number of chiller modules 100 and the multiple number of processing modules 60.

Though the coolant processing apparatus 200 according to the above-described exemplary embodiment has the single tank 220, a plurality of tanks may be provided.

The above-described exemplary embodiments are illustrative in all aspects and are not anyway limiting. In fact, the above-described exemplary embodiments can be embodied in various forms. Further, the above-described exemplary embodiments may be omitted, replaced and modified in various ways without departing from the scope and the spirit of claims.

According to the exemplary embodiment, it is possible to downsize the chiller module while maintaining the processing performance of the temperature control medium in the chiller module.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A coolant system including a movable coolant processing apparatus detachably connected to a coolant circulation path for circulating a coolant between a substrate processor and a chiller, the coolant circulation path including a first path for supplying the coolant to the substrate processor from the chiller and a second path for returning the coolant to the chiller from the substrate processor, the movable coolant processing apparatus comprising:

a housing;

movers configured to move the housing;

a first connector detachably connected to a first connection path branching from the first path;

a second connector detachably connected to a second connection path branching from the second path;

a pump disposed in the housing;

a battery electrically connected to the pump; and a coolant tank disposed in the housing, wherein the coolant circulated between the substrate processor and the chiller is collected from the second path to the coolant tank through the second connection path and the second connector before maintenance of the substrate processor or the chiller, and then the collected coolant is refilled from the coolant tank to the first path through the first connection path and the first connector by the pump after the maintenance of the substrate processor or the chiller.

2. The coolant system according to claim 1, wherein the movers include wheels attached on a bottom surface of the housing.

3. The coolant system according to claim 1, wherein the movers are configured such that the housing is self-propelled.

4. The coolant system according to claim 1, wherein the coolant tank has an additional coolant inlet connected to the second connector without the pump.

5. The coolant system according to claim 1, further comprising:

a third connector detachably connected to an exhaust path, wherein the coolant tank has an exhaust opening connected to the third connector.

6. The coolant system according to claim 5, wherein the first connector is a first female coupler detachably connected to a first male coupler attached to the first connection path, the second connector is a second male coupler detachably connected to a second female coupler attached to the second connection path, and the third connector is a third female coupler detachably connected to a third male coupler attached to the exhaust path.

7. The coolant system according to claim 5, wherein the first connector is a first male coupler detachably connected to a first female coupler attached to the first connection path, the second connector is a second female coupler detachably connected to a second male coupler attached to the second connection path, and the third connector is a third male coupler detachably connected to a third female coupler attached to the exhaust path.

8. The coolant system according to claim 1, wherein the first connector is a first female coupler detachably connected to a first male coupler attached to the first connection path, and the second connector is a second male coupler detachably connected to a second female coupler attached to the second connection path.

9. The coolant system according to claim 1, wherein the first connector is a first male coupler detachably connected to a first female coupler attached to the first connection path, and the second connector is a second female coupler detachably connected to a second male coupler attached to the second connection path.

10. The coolant system according to claim 1, further comprising:

a check valve connected between the pump and the second connector, and configured to suppress the coolant from flowing toward the pump.

11. The coolant system according to claim 1, wherein the pump is located outside the coolant tank and the pump is directly connected to the coolant tank.

* * * * *